US009147451B2

(12) United States Patent
Chong et al.

(10) Patent No.: US 9,147,451 B2
(45) Date of Patent: Sep. 29, 2015

(54) MEMORY DEVICE AND METHOD OF CONTROLLING LEAKAGE CURRENT WITHIN SUCH A MEMORY DEVICE

(71) Applicant: ARM Limited, Cambridge (GB)

(72) Inventors: Yew Keong Chong, New Braunfels, TX (US); Sanjay Mangal, Austin, TX (US); Hsin-Yu Chen, Austin, TX (US)

(73) Assignee: ARM Limited, Cambridge (GB)

( * ) Notice: Subject to any disclaimer, the term of this patent is extended or adjusted under 35 U.S.C. 154(b) by 266 days.

(21) Appl. No.: 13/847,743

(22) Filed: Mar. 20, 2013

(65) Prior Publication Data

US 2014/0286096 A1    Sep. 25, 2014

(51) Int. Cl.
G11C 11/00    (2006.01)
G11C 7/18    (2006.01)
G11C 16/10    (2006.01)
G11C 16/24    (2006.01)
G11C 16/26    (2006.01)

(52) U.S. Cl.
CPC  *G11C 7/18* (2013.01); *G11C 16/10* (2013.01); *G11C 16/24* (2013.01); *G11C 16/26* (2013.01)

(58) Field of Classification Search
CPC ..................... G11C 5/145; G11C 2211/4068
USPC .................. 365/154, 185.25, 203, 189.15
See application file for complete search history.

(56) References Cited

U.S. PATENT DOCUMENTS

| 2005/0002225 | A1 | 1/2005 | Kanehara et al. |
| 2005/0265079 | A1* | 12/2005 | Shirota ............... 365/185.21 |
| 2009/0251974 | A1 | 10/2009 | Chu et al. |
| 2010/0246302 | A1* | 9/2010 | Seko ........................ 365/205 |
| 2010/0278002 | A1 | 11/2010 | Chen et al. |
| 2011/0188314 | A1* | 8/2011 | Kuo et al. ............... 365/185.18 |

OTHER PUBLICATIONS

GB Search Report dated Aug. 29, 2014 in GB 1403904.4, 6 pages.

* cited by examiner

*Primary Examiner* — Han Yang
(74) *Attorney, Agent, or Firm* — Pramudji Law Group PLLC; Ari Pramudji (57) ABSTRACT

A memory device includes an array of memory cells arranged as a plurality of rows and columns, each row being coupled to an associated read word line, and each column forming at least one column group, where the memory cells of each column group are coupled to an associated read bit line. Each column group includes circuitry to precharge the associated read bit line to a first voltage level prior to the read operation. Each memory cell has coupling circuitry connected between the associated read bit line and a second voltage level different to the first voltage level. During read operation the coupling circuitry associated with the activated memory cell selectively discharges the associated read bit line towards the second voltage level dependent on the data value stored within that activated memory cell. The clamping circuitry connects the associated read bit line to the second voltage level.

19 Claims, 9 Drawing Sheets

BLOCK STRUCTURE
(CAN COMBINE MULTIPLE BLOCKS
TO FORM MEMORY ARRAY)

PER COLUMN
SENSE AMP
STRUCTURE

FIG. 1A

BLOCK STRUCTURE
(CAN COMBINE MULTIPLE BLOCKS
TO FORM MEMORY ARRAY)

PER COLUMN
SENSE AMP
STRUCTURE

NAND SENSE-AMP

FIG. 5A

INVERTER SENSE-AMP

MEMORY DEVICE AND METHOD OF CONTROLLING LEAKAGE CURRENT WITHIN SUCH A MEMORY DEVICE

FIELD OF THE INVENTION

The present invention relates to a memory device comprising an array of memory cells, and to a method of controlling leakage current within such a memory device.

DESCRIPTION OF THE PRIOR ART

As process geometries shrink in modern data processing systems, the variability in the operating characteristics of the individual circuit elements increases. Considering as an example a memory device consisting of an array of memory cells, it will be understood that each memory cell will typically consist of a number of electronic components such as transistors, and the variability in those individual components significantly increases as process geometries shrink. Furthermore, there is an increasing desire to operate data processing systems at lower and lower supply voltages, but as the supply voltage decreases, reliability issues due to the variations in the individual components become more prominent.

One reliability concern arises from the fact that leakage current can increase within the individual memory cells as the process geometries shrink. There are various potential leakage current paths within a memory device, but one area of concern is leakage current arising through components connected to a bit line within the memory device.

An array of memory cells will typically be arranged as a plurality of rows and columns, each row of memory cells being coupled to at least one associated word line (in some implementations there will be separate word lines for write operations and read operations), and each column of memory cells forming at least one column group. One or more bit lines will typically be associated with each column group (again some implementations will provide separate write bit lines and read bit lines), and each memory cell in the column group will have components coupled to such bit lines.

It is known to provide memory devices where all or a part of the memory device can be placed into a non-active mode of operation when it is known that the memory cells within the device/that part of the device will not be accessed for a period of time. During the non-active mode of operation, there will continue to be various components coupled to the bit lines, and these can give rise to leakage paths through which leakage current occurs, increasing the power consumption of the device. One known way to seek to reduce leakage current is to cause the voltage on such bit lines to float during such a non-active mode of operation, but whilst this can reduce leakage current in some situations, it still does not remove the possibility of significant leakage current being drawn through some components.

Considering as an example a single-ended memory cell, such a memory cell uses a single read bit line coupled via coupling circuitry to an internal node of the memory cell to allow the data value stored in that memory cell to be read during a read operation. The single read bit line is precharged to a first voltage level (typically the supply voltage Vdd) prior to a read operation, and then if a memory cell coupled to that read bit line is addressed during a read operation (by an asserted read word line signal on the read word line to which that memory cell is coupled), the voltage on the bit line will either stay at the first voltage level, or will discharge towards the second voltage level, depending on the value stored within the memory cell.

When in the non-active mode of operation, all of the memory cells within a column group will still be coupled to the read bit line via their associated coupling circuitry, and this can give rise to significant leakage current. By allowing the read bit line to float in the non-active mode of operation, rather than continue to be precharged to the first voltage level, this can reduce the leakage current, but significant leakage current can still be observed.

Accordingly, it would be desirable to provide an improved technique for reducing leakage current within a memory device, particularly when at least a part of the memory device is in a non-active mode of operation.

SUMMARY OF THE INVENTION

Viewed from a first aspect, the present invention provides a memory device comprising: an array of memory cells arranged as a plurality of rows and columns, each row of memory cells being coupled to an associated read word line, each column of memory cells forming at least one column group, and the memory cells of each column group being coupled to an associated read bit line, each column group having an active mode of operation where a read operation may be performed on an activated memory cell within that column group, and a non-active mode of operation where said read operation cannot be performed; precharge circuitry configured, for each column group in said active mode of operation, to precharge the associated read bit line to a first voltage level prior to said read operation; each memory cell comprising coupling circuitry connected between the associated read bit line and a second voltage level different to said first voltage level, during said read operation the coupling circuitry associated with the activated memory cell being configured to selectively discharge the associated read bit line towards the second voltage level dependent on a data value stored within that activated memory cell; and the memory device further comprising clamping circuitry configured, for each column group in said non-active mode of operation, to connect the associated read bit line to said second voltage level, in order to remove a leakage current path through the coupling circuitry of each memory cell of that column group.

In accordance with the present invention, for each column group in the non-active mode of operation, the leakage current path that would otherwise be present through the coupling circuitry of each memory cell within that column group is removed, by using clamping circuitry to connect the associated read bit line to the second voltage level. As a result, each such coupling circuitry is then connected between the associated read bit line (at the second voltage level) and the second voltage level, and accordingly no leakage current can pass through such coupling circuits. This significantly reduces the observed leakage current when at least a part of the memory device is placed into the non-active mode of operation.

In one embodiment, the precharge circuitry is disabled for each column group in the non-active mode of operation. This prevents the precharge circuitry from seeking to fight against the action of the clamping circuitry, by preventing the precharge circuitry from seeking to pull the voltage on the relevant read bit line back towards the first voltage level.

The clamping circuitry can take a variety of forms. However, in one embodiment the clamping circuitry comprises a clamping unit for each column group, and the memory device comprises control circuitry configured to generate a clamp enable signal for each of the clamping units, and to set the clamp enable signal for each clamping unit associated with a column group in said non-active mode, each clamping unit being responsive to a set clamp enable signal to connect the associated read bit line to said second voltage level. This allows each clamping unit to be controlled independently, and hence allows a great deal of configurability as to which column groups are placed in the non-active mode of operation at any particular point in time, whilst still allowing the clamping functionality to be performed in respect of those column groups.

Whilst each clamping unit can be constructed in a variety of ways, in one embodiment each clamping unit comprises NMOS transistor circuitry, and the clamp enable signal is set to a logic one value. The NMOS transistor circuitry can be arranged in a variety of ways. For example, to increase the drive strength, it can be constructed from a plurality of NMOS transistors in parallel, and this would enable a stronger driving of the associated read bit line to the second voltage level during the non-active mode of operation. However, it would increase the leakage current through the NMOS transistor circuitry in the active mode of operation when compared with a weaker NMOS transistor circuitry. Conversely, the NMOS transistor circuitry could be constructed from a plurality of NMOS transistors arranged as a stack in series between the associated read bit line and the second voltage level. This would decrease the drive strength during the non-active mode of operation, but would result in less leakage current during the active mode of operation.

In one embodiment, the memory device further comprises sense amplifier circuitry connected to the associated read bit line of each column group and configured, during said read operation, to determine whether the voltage on the read bit line associated with any column group in said active mode of operation that contains said activated memory cell transitions towards the second voltage level, such a transition indicating that a data value stored in that activated memory cell has a first value.

Whilst the sense amplifier circuitry can be constructed in a variety of ways, in one embodiment said sense amplifier circuitry comprises a plurality of sense amplifier units, each sense amplifier unit being connected to the associated read bit line of at least one column group. When each column group in said at least one column group associated with one of said sense amplifier units is in the non-active mode of operation, the action of the clamping circuitry to connect to the second voltage level each associated read bit line for said at least one column group causes an output signal of that sense amplifier unit to be set to a first predetermined state which reduces leakage current in further coupling circuitry used to couple the output signal of the sense amplifier unit to a global bit line. Hence, in such embodiments, not only is the leakage current path through the coupling circuits of each memory cell that is in a non-active mode of operation removed, but in addition a reduction in the leakage current in the further coupling circuitry used to couple the output of the sense amplifier unit to a global bit line is also reduced, providing further leakage current savings.

In one embodiment, the global bit line is precharged to the first voltage level, and selectively discharged during said read operation to the second voltage level, and said first predetermined state causes the further coupling circuitry to connect the global bit line to the second voltage level. Accordingly, in such an embodiment, the only leakage current path on the global bit line will typically be through the precharge device used to precharge the global bit line to the first voltage level when in the active mode of operation. This is typically a relatively small PMOS precharge device, and accordingly does not contribute significant leakage current.

The further coupling circuitry used to connect the output of the sense amplifier circuitry to the global bit line can take a variety of forms, but in one embodiment comprises further NMOS transistor circuitry connected between the global bit line and the second voltage level, and said first predetermined state is a logic 1 value.

The number of column groups associated with each sense amplifier unit will be dependent on implementation. For example, in one embodiment, each column group will have its own sense amplifier unit, which may for example be constructed as an inverter circuit. However, in an alternative embodiment, each sense amplifier unit is associated with a pair of column groups, and comprises a NAND gate structure. Both column groups in the pair will be placed in the non-active mode of operation at the same time, and the action of the clamping circuitry to connect to said second voltage level the associated read bit line for both column groups in the pair reduces leakage current within the NAND gate structure during the non-active mode of operation. In particular, a typical NAND gate structure may be formed by a pair of relatively large PMOS transistor devices in parallel, and a pair of relatively small NMOS devices provided in a stacked arrangement. The clamping circuitry causes both of the inputs to the NAND gate structure to be pulled to the second voltage level (for example a logic zero level), which causes the relatively large PMOS devices to be held in the on state, whilst the small NMOS devices are placed in the off state. This removes a potential leakage current path through the stacked NMOS devices, thereby reducing leakage current within the sense amplifier unit.

Whilst the granularity with which column groups are placed in the non-active mode of operation may vary dependent on embodiment, in one embodiment the column groups within an entire bank of memory will be placed into the non-active mode of operation at the same time, and accordingly the clamp enable signal will be set at that point for each clamping circuitry within that bank of memory.

In one embodiment, the memory device further comprises word line driver circuitry configured, during a read operation, to issue an asserted read word line pulse signal on the read word line coupled to an addressed row of the array so as to activate the memory cells within that addressed row whilst the read word line pulse signal is asserted. In addition, sense amplifier circuitry is connected to the associated read bit line of each column group, and is configured for each activated memory cell to determine that that activated memory cell stores a first value if the voltage on the associated read bit line transitions to a trip voltage level between said first and said second voltage levels whilst the read word line pulse signal is asserted, and to determine that that activated memory cell stores a second value if the voltage on the associated read bit line does not transition to said trip voltage level whilst the read word line pulse signal is asserted.

In one embodiment, the memory device may further comprise bit line keeper circuitry coupled to each read bit line and configured during a read operation to weakly pull the voltage on each read bit line towards the first voltage level so as to avoid leakage current within the coupling circuitry of the memory cells of the associated memory cell group from causing the voltage on the associated read bit line to transition to said trip voltage level between said first and said second voltage levels whilst the read word line pulse signal is asserted. The bit line keeper circuitry hence ensures that the correct data value is detected by the read operation, by preventing leakage current within the coupling circuitry from potentially causing an incorrect value to be sensed.

The coupling circuitry associated with each memory cell can take a variety of forms. However, in one embodiment the coupling circuitry of each memory cell comprises a plurality of coupling transistors arranged in series between the associated read bit line and a terminal at the second voltage level, a gate terminal of at least one of the coupling transistors being connected to the associated read word line and a gate terminal of at least one other of the coupling transistors being connected to an internal storage node of the memory cell. In one particular embodiment, the coupling transistors are NMOS transistors.

The first and second voltage levels will vary dependent on implementation. However, in one embodiment the first voltage level is a supply voltage level and the second voltage level is a ground voltage level.

Whilst in one embodiment each column of memory cells may include a single column group, in an alternative embodiment each column of memory cells forms a plurality of column groups.

Viewed from a second aspect, the present invention provides a method of controlling leakage current within a memory device comprising an array of memory cells arranged as a plurality of rows and columns, each row of memory cells being coupled to an associated read word line, each column of memory cells forming at least one column group, and the memory cells of each column group being coupled to an associated read bit line, each column group having an active mode of operation where a read operation may be performed on an activated memory cell within that column group, and a non-active mode of operation where said read operation cannot be performed, the method comprising: for each column group in said active mode of operation, precharging the associated read bit line to a first voltage level prior to said read operation; for each memory cell, providing coupling circuitry connected between the associated read bit line and a second voltage level different to said first voltage level; during said read operation, employing the coupling circuitry associated with the activated memory cell to selectively discharge the associated read bit line towards the second voltage level dependent on a data value stored within that activated memory cell; and for each column group in said non-active mode of operation, connecting the associated read bit line to said second voltage level, in order to remove a leakage current path through the coupling circuitry of each memory cell of that column group.

Viewed from a third aspect, the present invention provides a memory device comprising: an array of memory cell means arranged as a plurality of rows and columns, each row of memory cell means for coupling to an associated read word line, each column of memory cell means for forming at least one column group, and the memory cell means of each column group for coupling to an associated read bit line, each column group having an active mode of operation where a read operation may be performed on an activated memory cell means within that column group, and a non-active mode of operation where said read operation cannot be performed; precharge means, for each column group in said active mode of operation, for precharging the associated read bit line to a first voltage level prior to said read operation; each memory cell means comprising coupling means for connecting between the associated read bit line and a second voltage level different to said first voltage level, during said read operation the coupling means associated with the activated memory cell means for selectively discharging the associated read bit line towards the second voltage level dependent on a data value stored within that activated memory cell means; and the memory device further comprising clamping means, for each column group in said non-active mode of operation, for connecting the associated read bit line to said second voltage level, in order to remove a leakage current path through the coupling means of each memory cell means of that column group.

Viewed from a fourth aspect, the present invention provides a computer program storage medium (for example a non-transitory storage medium) storing a memory compiler computer program for controlling a computer to generate an instance of a memory device from a memory architecture associated with the memory compiler computer program, the memory architecture specifying a definition of circuit elements and data defining rules for combining those circuit elements, such that said instance generated specifies a memory device in accordance with the first aspect of the present invention.

BRIEF DESCRIPTION OF THE DRAWINGS

The present invention will be described further, by way of example only, with reference to embodiments thereof as illustrated in the accompanying drawings, in which.

DESCRIPTION OF EMBODIMENTS

Figure 1A:
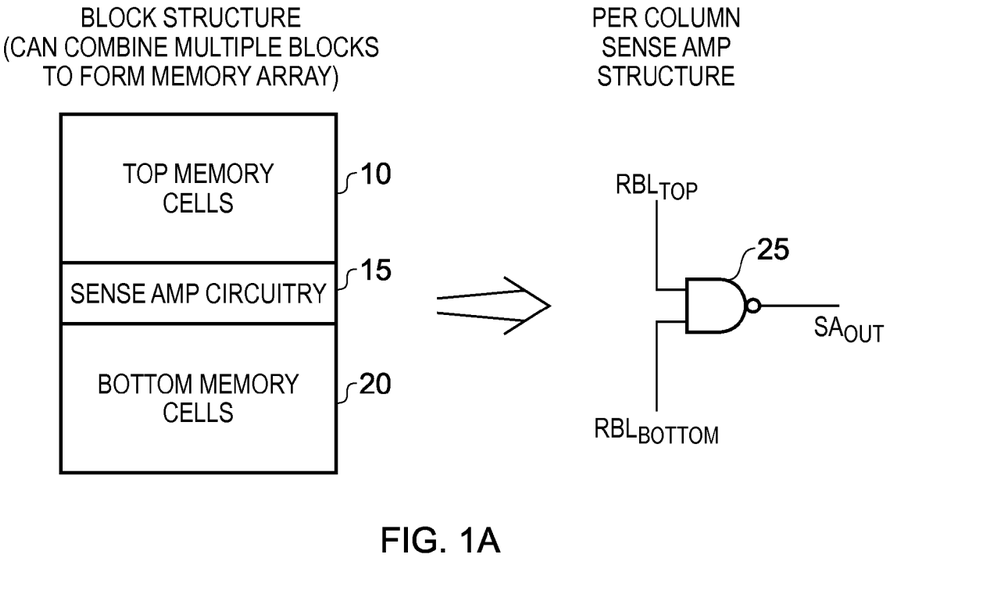
FIGS. 1A and 1B illustrate two alternative configurations of memory block structures that can be used to form a memory array of a memory device in accordance with embodiments.
Figure 1B:
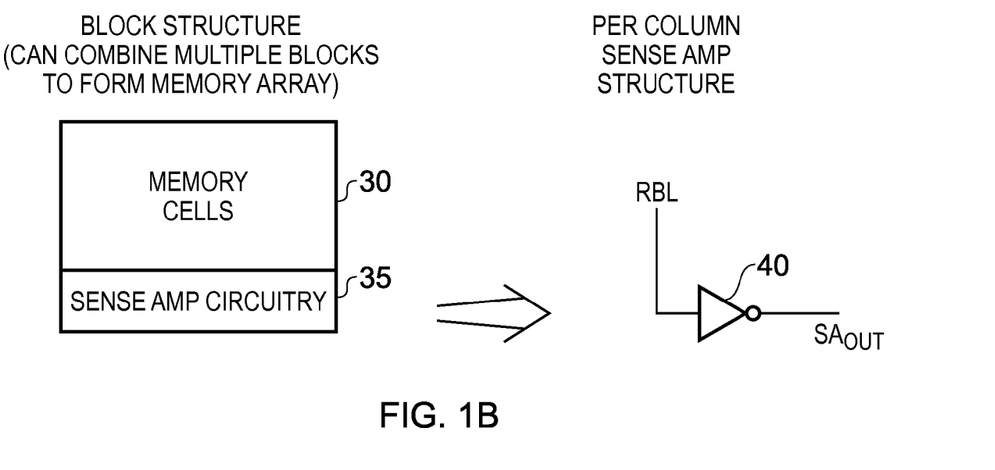

A memory device in accordance with one embodiment comprises an array of memory cells arranged as a plurality of rows and columns, each row of memory cells being coupled to an associated read word line, and each column of memory cells forming at least one column group, with the memory cells of each column group being coupled to an associated read bit line. The memory array may be constructed using block structures such as shown in FIGS. 1A and 1B. Whilst in one embodiment the memory array may comprise a single block structure, in an alternative embodiment multiple block structures may be used to form the memory array.

Considering the block structure of FIG. 1A, two memory cell groups are defined, namely a top memory cell group 10 and a bottom memory cell group 20, both of these memory cell groups sharing the same sense amplifier circuitry 15. The top and bottom memory cell groups may provide multiple columns of cells, but each column within a particular memory cell group will form the earlier mentioned column group. Accordingly, in this embodiment each column of memory cells within the top memory cell group 10 will be connected to an associated read bit line, and each column of memory cells within the bottom memory cell group 20 will also be connected to an associated read bit line. The read bit lines connected to columns of the top memory cell group will be referred to as top read bit lines ($RBL_{TOP}$) whilst the read bit lines associated with columns of the bottom memory cell group 20 will be referred to as bottom read bit lines ($RBL_{BOTTOM}$).

In accordance with the design of FIG. 1A, for each top read bit line and corresponding bottom read bit line, the sense amplifier circuitry will provide a NAND gate structure 25 to produce a consolidated sense amplifier output for that pair of read bit lines. Prior to a read operation, both bit lines will be precharged to a logic one value. During the read operation, a read word line pulse signal will be asserted to activate the memory cells within an addressed row of the array, and accordingly considering a particular pair of top and bottom read bit lines, at most only one of the memory cells connected to those pair of bit lines will be activated. During the read operation, that activated memory cell will discharge the voltage on its associated read bit line towards the logic zero voltage level (typically a ground voltage level) if a data value stored in that activated memory cell has a first value. If instead the data value is at a second value, no such discharging will be performed. Due to the operation of the NAND gate structure, it will be appreciated that the sense amp output signal will remain at a logic zero value if neither of the pair of read bit lines is discharged, but will flip to a logic one value if either one of the read bit lines is discharged towards a logic zero level. Hence, when the activated memory cell stores the first value, the sense amplifier output should flip from a logic zero value to a logic one value during the period whilst the read word line pulse signal is asserted, but if the activated memory cell stores the second value the sense amplifier output should not flip, and instead should remain at the logic zero level.

FIG. 1B illustrates an alternative block structure, where each group of memory cells 30 has its own associated sense amplifier circuitry 35. In this example, the sense amplifier circuitry can be constructed using an inverter 40, and again the sense amplifier output observes the same property as described earlier with reference to FIG. 1A. In particular, if an addressed memory cell in a column stores the first value, the bit line should discharge towards a logic zero level, causing the sense amplifier output to flip to a logic one value during the period whilst the read word line pulse signal is asserted. If instead the addressed memory cell stores the second value, no flip in the output of the sense amplifier should occur, and instead it should remain at a logic zero level.

Figure 2:
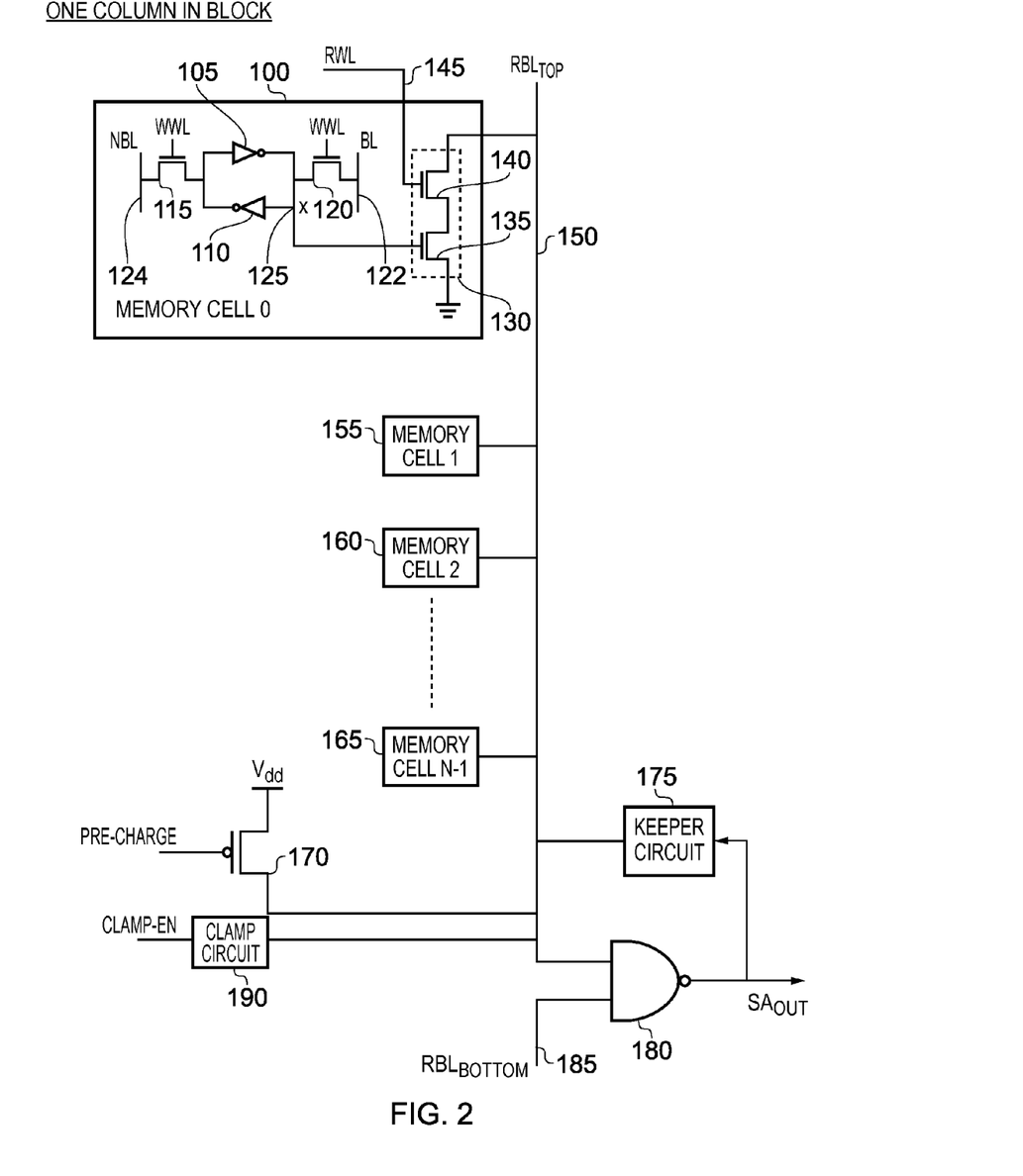
FIG. 2 illustrates components provided in association with one column within a block structure in accordance with the arrangement of FIG. 1A.

FIG. 2 is a diagram illustrating the components provided in association with a single column within the block structure of FIG. 1A in accordance with one embodiment. In particular, the components connected to the top read bit line 150 are illustrated, that read bit line 150 providing one input to the NAND gate 180. The bottom read bit line 185 provides the second input, and will have the same arrangement of components connected to it as are shown in FIG. 2 in respect of the top read bit line 150.

Considering the top read bit line 150, a series of memory cells 100, 155, 160, 165 are connected to the read bit line. Each memory cell has the form shown in detail with respect to the memory cell 100. In particular, the basic memory cell consists of the two NMOS pass gate transistors 115, 120 and the two inverters 105, 110 (formed in the standard way using an arrangement of four transistors), but in addition coupling circuitry 130 consisting of two NMOS transistors 135, 140 is also provided for use during a read operation.

Considering first a write operation directed to the memory cell 100, the write word line (WWL) signal will be asserted to turn on the pass gate transistors 115, 120. Write driver circuitry will then control the voltages on the write bit lines 122, 124 in order to cause the required data value to be written into the memory cell, and at the end of the write operation the write word line signal will be de-asserted to turn off the pass gate transistors 115, 120, and hence isolate the data holding part of the cell formed by the inverters 105, 110 from the write bit lines 122, 124. Accordingly, at this point a logic one or a logic zero value will be stored at the node X 125, dependent on the voltages driven on the bit lines 122, 124 during the write operation.

During a read operation, a signal on the read word line 145 will be asserted, turning on the transistor 140 of the coupling circuitry 130 for an addressed row of memory cells. Prior to the read word line signal being asserted, the read bit line 150 will have been precharged to the logic one (Vdd) level using the precharge PMOS transistor 170, and accordingly it can be seen that once the read word line signal is asserted, the read bit line 150 will selectively discharge towards the logic zero level dependent on the value stored at the node X 125 within the memory cell 100. In particular, if the node 125 stores a first value, namely a logic one value, this will turn on the NMOS transistor 135, and cause the bit line 150 to be discharged towards ground. Conversely, if the node 125 stores a logic zero value, the transistor 135 will not be turned on, and the voltage on the bit line should remain at the Vdd level. The sense amplifier 180 will initially have an output at a logic zero level, but as discussed earlier that output will flip to a logic one level during the course of the read operation if the node 125 stores a logic one value and hence the read bit line 150 is discharged.

However, it will be noted that multiple memory cells are coupled to the read bit line 150, each having associated coupling circuitry 130. As device geometries shrink, it has been found that the leakage current through the coupling circuitry has become more significant. In particular, whilst only one of the coupling circuits within the column will have its transistor 140 turned on by an asserted read word line signal, all of the other coupling circuits may contribute to leakage current. The most significant cause of the leakage current is from non-addressed memory cells that store at their node 125 a logic one value. In this situation, although the coupling transistor 140 is turned off, the coupling transistor 135 is turned on, and leakage current through the coupling circuit 130 in that situation will tend to pull the voltage on the read bit line 150 down towards the logic zero level. Some further leakage current also occurs in non-addressed memory cells where the node X 125 stores a logic zero value, and indeed in connection with an addressed memory cell where node X 125 stores a logic zero value (in which case the transistor 140 will be turned on but the transistor 135 will be turned off).

It has been found that as process geometries shrink and the leakage current increases, these effects can potentially give rise to a situation where even though the addressed memory cell stores a logic zero value at its node 125, and accordingly the bit line 150 should remain at the Vdd supply level during the read operation, the leakage current causes the voltage on the bit line to discharge to a significant extent during the period in which the read word line is asserted that the sense amplifier 180 flips its output state to a logic one value, thereby giving an incorrect read value.

In accordance with the embodiment illustrated in FIG. 2, a keeper circuit 175 is provided to prevent such a situation arising. The keeper circuit can take a variety of forms. In one embodiment, the keeper circuit takes the form of a PMOS structure whose source and drain are connected between VDD and the read bit line, and whose gate is connected to the output from the sense amplifier. At the end of the precharge phase, the top read bit line 150 and the bottom read bit line 185 will be precharged to a logic one level, meaning that the output of the NAND gate 180 is at a logic zero level, hence turning on the PMOS structure within the keeper circuit, and causing the read bit line to be weakly pulled towards the logic one level. If during a subsequent read operation, the addressed memory cell does not store a data value which causes the read bit line to be discharged, then the above mentioned leakage current in the coupling circuits 130 will be insufficient to overcome the weak pull up function of the keeper circuit 175, and hence will prevent an incorrect sensing of the data value stored within the addressed memory cell.

Other forms of keeper circuit can also be provided if desired. For example, a pulse driven keeper circuit is described in commonly owned, co-pending U.S. patent application Ser. No. 13/612,953, the entire contents of which are hereby incorporated by reference.

In accordance with the described embodiments, individual blocks of columns can be placed into a non-active mode of operation when it is known that the memory cells connected to that column are not to be accessed for a period of time. By placing such a column in a non-active mode of operation, this can reduce power consumption. However, if in such a non-active mode of operation the read bit lines 150, 185 were to continue to be precharged to the supply voltage level, then a significant leakage current can arise through the coupling circuitry 130 of the various memory cells connected to those bit lines. To remove that potential leakage current path, a clamp circuit 190 is provided connected to each of the bit lines 150, 185, the clamp circuit being controlled by a clamp enable (CLAMP EN) signal. In particular, when the associated column is to be placed in the non-active mode of operation, control circuitry will set the clamp enable signal for the relevant clamp circuit(s), causing the clamp circuit(s) to discharge the associated read bit line to the logic zero level. At the same time, the operation of the associated precharge circuitry 170 will be disabled to avoid the precharge circuitry seeking to fight against the discharging of the read bit line by the clamping circuit 190. By placing the read bit line 150 at the logic zero level, it will be appreciated that each coupling circuit 130 associated with that bit line is connected at both ends to ground, and hence no leakage current will be drawn through the stack of NMOS transistors forming those coupling circuits.

Figure 3A:
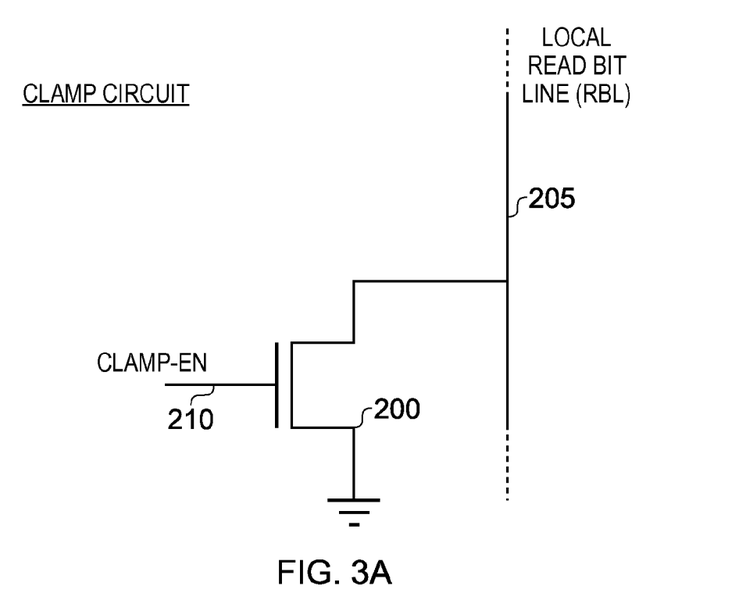
FIGS. 3A to 3C illustrate clamp circuits of FIG. 2 in accordance with different embodiments.

The clamping circuitry 190 can take a variety of forms, but in one embodiment takes the form illustrated in FIG. 3A. Hence, for each local read bit line 205, the clamping circuitry takes the form of an NMOS transistor structure 200 connected between the read bit line and ground, with the gate of the NMOS transistor structure receiving the clamp enable signal over path 210. Accordingly, if the clamp enable signal is asserted at a logic one value, this will turn on the NMOS structure 200 and cause the local read bit line to be pulled towards a logic zero level.

Figure 3B:
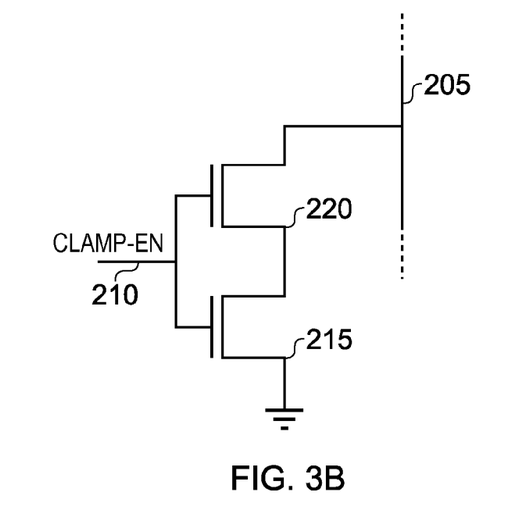
Figure 3C:
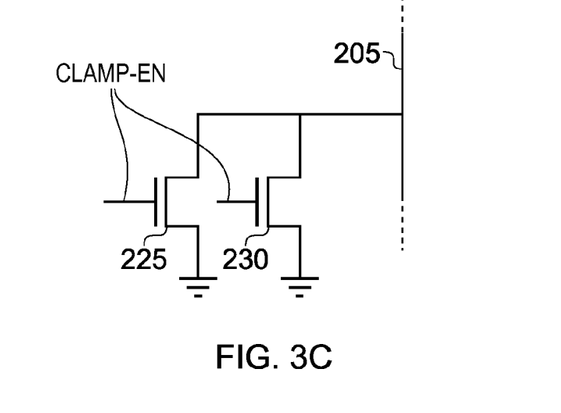

Whilst only a single NMOS transistor is schematically shown in FIG. 3, it will be appreciated that the NMOS transistor structure 200 may be constructed in a variety of ways. For example, as shown in FIG. 3B, the NMOS transistor circuitry could be constructed from a plurality of NMOS transistors 215, 220 arranged as a stack in series between the associated read bit line 205 and the ground potential. This would decrease the drive strength during the non-active mode of operation, but would result in less leakage current during the active mode of operation when compared with a stronger NMOS transistor circuitry. Conversely, as shown in FIG. 3C, to increase the drive strength the NMOS transistor circuitry can be constructed from a plurality of NMOS transistors 225, 230 in parallel, and this would enable a stronger driving of the associated read bit line to the second voltage level during the non-active mode of operation. However, it would increase the leakage current through the NMOS transistor circuitry in the active mode of operation when compared with a weaker NMOS transistor circuitry. Whilst in both FIGS. 3B and 3C only two transistors are shown, it will be appreciated that the number of transistors used can be varied dependent on the desired drive strength, the process geometries, etc.

Figure 4:
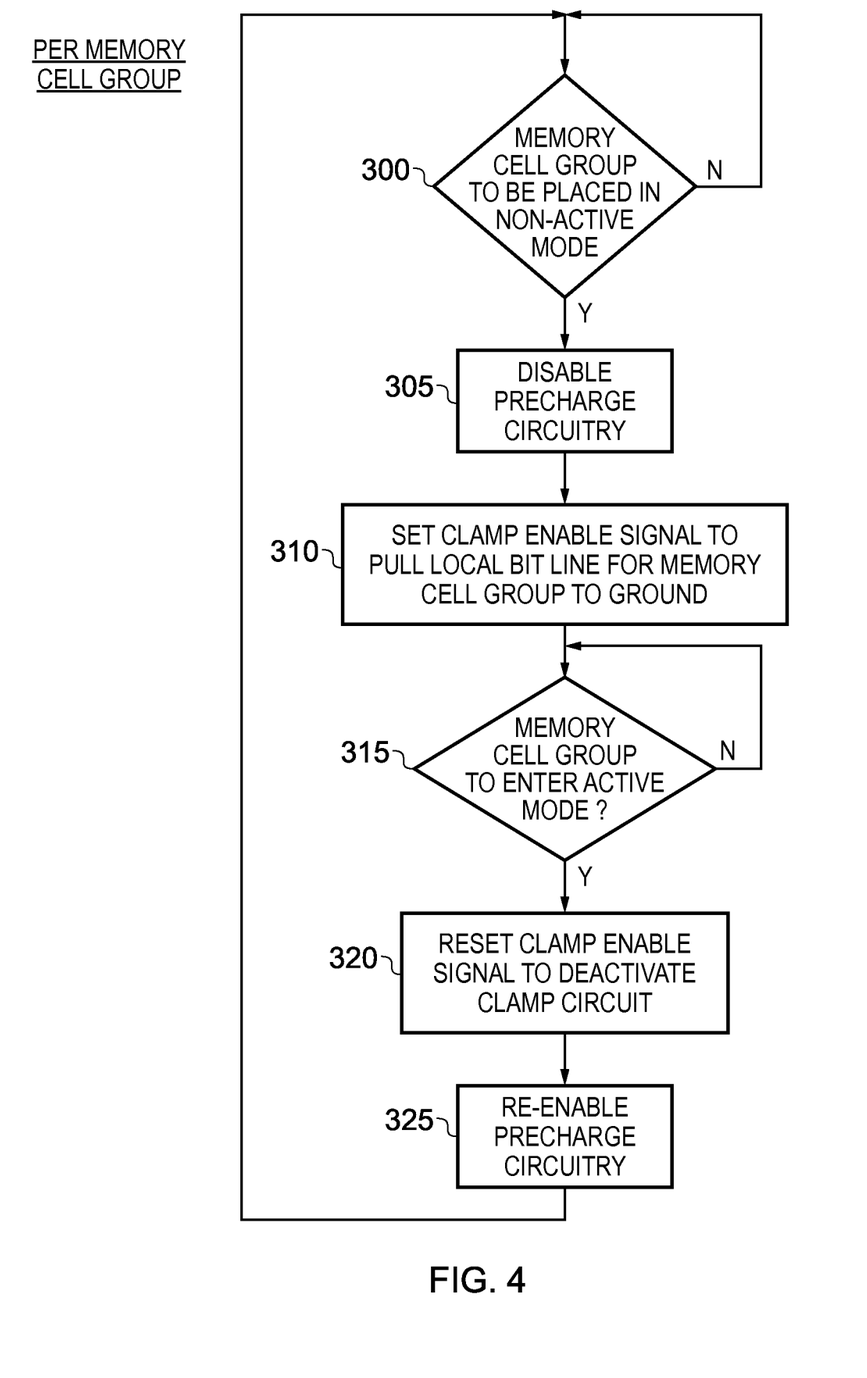
FIG. 4 is a flow diagram illustrating steps taken for each memory cell group when switching between an active mode of operation and a non-active mode of operation, in accordance with one embodiment.

FIG. 4 is a flow diagram illustrating the steps that may be performed by control circuitry when transitioning the memory cells of a memory cell group between an active mode of operation and a non-active mode of operation. At step 300, it is determined whether the memory cell group is to be placed in the non-active mode of operation. The process loops at step 300 until it is determined that the memory cell group is to be placed in the non-active mode of operation, whereafter the process proceeds to step 305, where the precharge circuitry 170 for that memory cell group is disabled. At step 310, the clamp enable signal for the relevant clamp circuitry 190 is then set, causing the local read bit line associated with the memory cell group to be pulled to the ground potential level. At this point, the potential leakage current path through the coupling circuits 130 will have been removed.

The process then proceeds to step 315, where it is determined whether the memory cell group is to re-enter the active mode of operation. If not, the process merely loops at step 315, but when subsequently it is decided that the memory cell group is to enter the active mode of operation again, then the process proceeds to step 320 where the clamp enable signal is reset in order to deactivate the clamping circuitry. At step 325, the precharge circuitry is re-enabled, whereafter read operations can be performed in the normal way with regards to addressed memory cells within the memory cell group. The process then returns to step 300.

Whilst steps 305 and 310 are shown being performed sequentially, their order can be reversed, or indeed both steps can be performed in parallel. Similarly, the ordering of steps 320 and 325 can be reversed, or those two steps can also be performed in parallel.

Figure 5A:
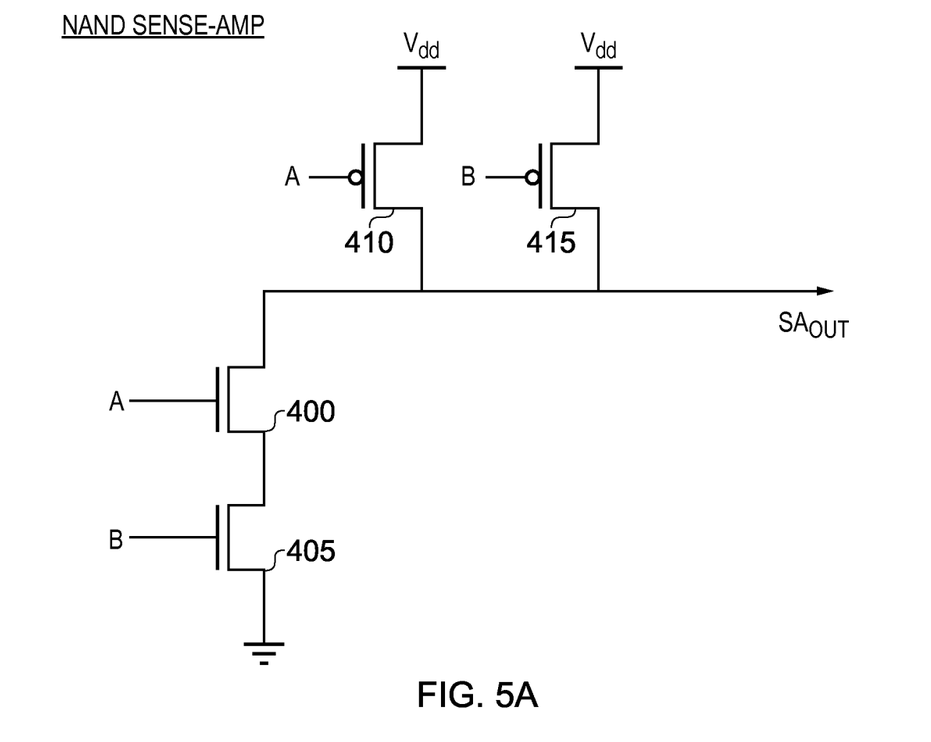
FIGS. 5A and 5B illustrate the per column sense amplifier structure of FIGS. 1A and 1B, respectively, in accordance with one embodiment.

FIG. 5A is a diagram illustrating the structure of the NAND gate sense amp unit 180 of FIG. 2 in accordance with one embodiment. The inputs A and B represent the inputs from the top read bit line and bottom read bit line. During a precharge operation, it will be appreciated that the values of A and B will both be pulled to the logic one value, causing the stack of NMOS transistors 400, 405 to turn on, and the PMOS transistors 410, 415 to turn off. As a result, the output from the sense amplifier will be at a logic zero level. During a subsequent read operation, if an addressed memory cell within the column stores a value that causes the associated read bit line to be pulled towards a logic zero level, this will cause one of the NMOS transistors 400, 405 to turn off, and the corresponding one of the PMOS transistors 410, 415 to turn on, hence causing the output of the sense amplifier to flip to the logic one level. Conversely, if the stored state in the addressed memory cell does not cause the associated read bit line to discharge, the output of the sense amplifier will not change during the period in which the read word line is asserted.

When in the earlier described non-active mode of operation, the operation of the clamp circuitry will cause both of the read bit lines to be pulled to the logic zero level and as a result both of the PMOS transistors 410, 415 will be turned on and both of the NMOS transistors 400, 405 will be turned off. This represents a particularly low leakage current situation for the sense amplifier. In particular, the relatively large PMOS devices will be held in the on state, and the stack of relatively small NMOS devices will be held in the off state, thus reducing leakage current. Hence, in addition to removing the leakage current path that might otherwise be associated with the various coupling circuits 130 of FIG. 2, use of the clamp circuit also places the sense amplifier circuitry 180 into a low leakage current state.

Figure 5B:
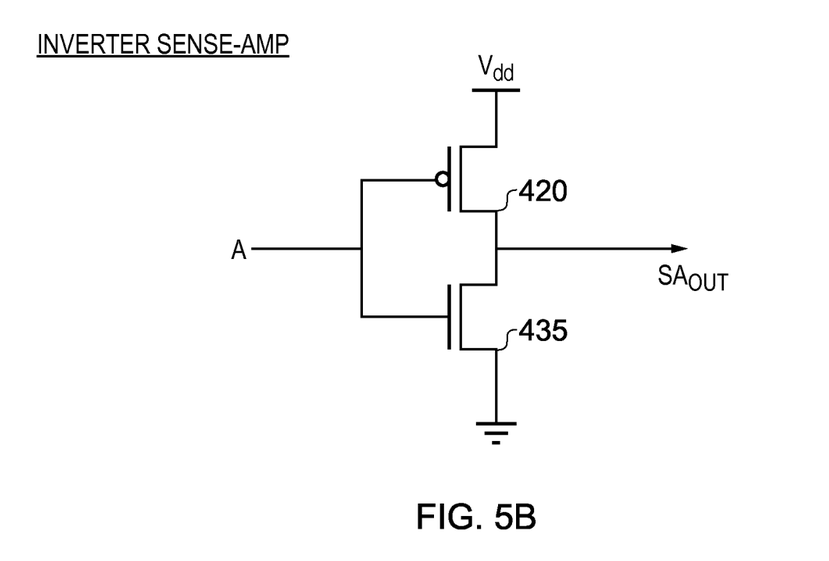

FIG. 5B illustrates the inverter form of sense amplifier circuitry associated with the embodiment of FIG. 1B. As will be well understood, the inverter comprises a PMOS transistor 420 placed in series with an NMOS transistor 435 between the supply potential VDD and ground. Whilst the use of the clamp circuit 190 does not reduce the leakage current situation within the inverter based sense amplifier of FIG. 5B, it does ensure that the output of the sense amplifier is placed in a predefined state, this also being the case when using the NAND based sense amplifier of FIG. 5A. This should be contrasted with the known prior art approach, where the read bit lines are allowed to float during the non-active mode of operation, since in such an arrangement the output of the sense amplifier circuitry will not be in a predefined state.

Furthermore, the predefined state that the sense amplifier circuits of FIGS. 5A and 5B are placed in when the clamp circuitry is used in the non-active mode of operation further serves to reduce the leakage current associated with components connected to the output of the sense amplifier, as will be discussed further with reference to FIG. 6 below.

Figure 6:
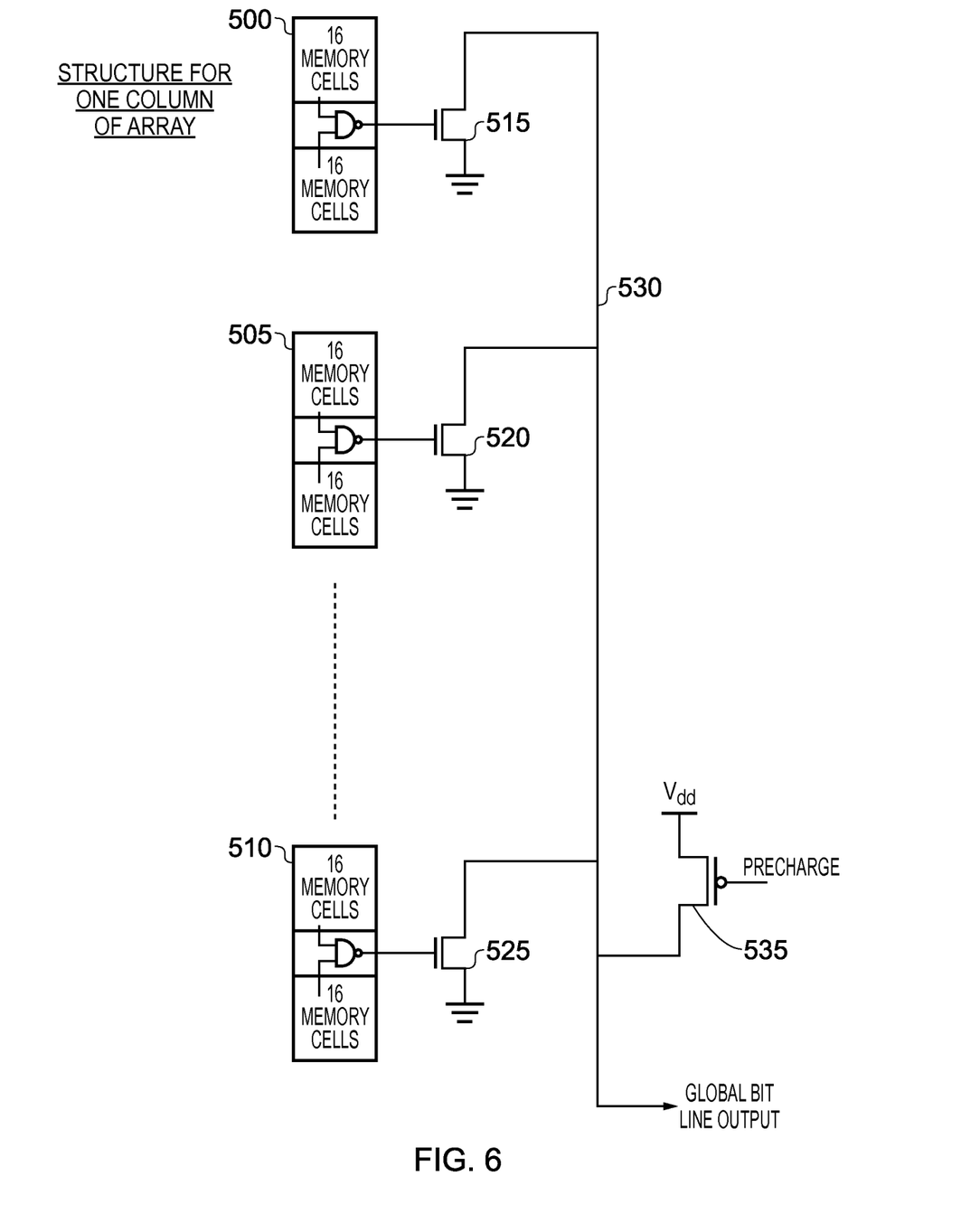
FIG. 6 illustrates how a plurality of block structures in accordance with FIG. 1A may be coupled to form a column of the memory array with an associated global read bit line.

FIG. 6 shows an arrangement where multiple of the block structures of FIG. 1A are arranged to form a column of the memory array. FIG. 6 shows one such column, where the top memory cell region and bottom memory cell region of each block contains 16 memory cells within their column group. The output from each sense amp is provided as an input to a corresponding NMOS transistor 515, 520, 525, and accordingly it will be seen that if any of the blocks 500, 505, 510 include an addressed memory cell that stores a logic one value at its node X 125, then the sense amp output will transition to a logic one level during the read operation and hence turn on the corresponding NMOS transistor. However, only one of those transistors will be turned on, since for any particular read operation, there will only be one addressed memory cell within a particular column. Hence, the global bit line 530, which is precharged by the precharge circuitry 535 to a logic one level prior to the start of the read operation, will be discharged towards a logic zero level if the addressed memory cell stores a logic one value at its node X 125. Otherwise, the global bit line output will remain at a logic one level. The voltage on the global bit line 530 can then be sensed by an appropriate global sense amplifier structure (not shown), for example an inverter.

In one embodiment each of the block structures 500, 505, 510 includes the earlier described clamping circuits. Accordingly, when the column 500, 505, 510 is placed in the non-active mode of operation, then all of the sense amp circuits will output a logic one value, causing all of the NMOS transistors 515, 520, 525 to be turned on, and hence pull the global bit line 530 down to a logic zero level. Typically, the precharge transistor 535 will be deactivated during this non-active mode of operation. Accordingly, it can be seen that such an approach removes the potential leakage current paths through all of the NMOS transistors 515, 520, 525, and the only leakage path on the global bit line is then through the relatively small PMOS precharge transistor 535. This further reduces the overall system leakage current.

In an alternative embodiment, it is sufficient that only one of the block structures 500, 505, 510 forming a column includes the earlier described clamping circuit, since this will still be sufficient to turn on the associated NMOS transistor and pull the voltage on the global bit line to ground, thereby reducing leakage current.

Figure 7:
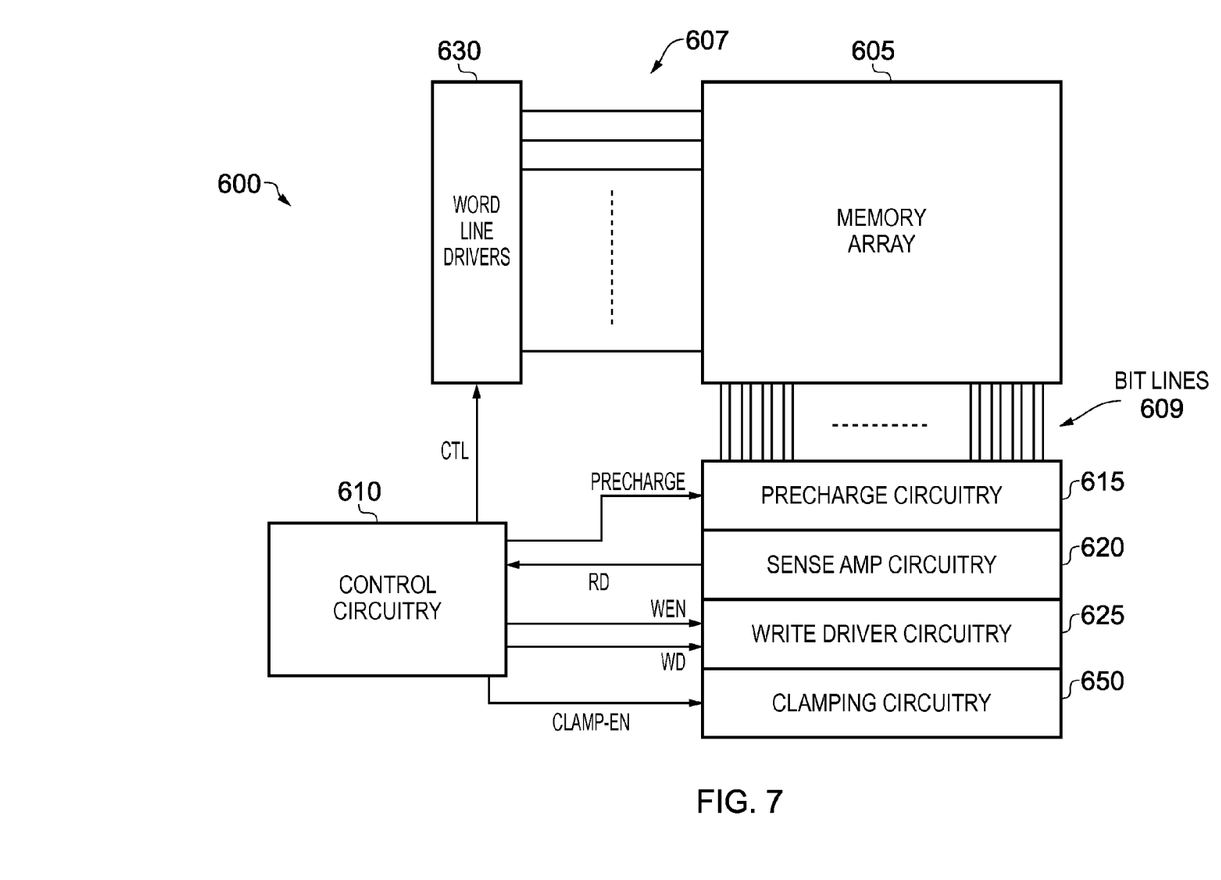
FIG. 7 is a block diagram schematically illustrating the logical arrangement of a memory device in accordance with one embodiment.

FIG. 7 is a diagram schematically illustrating a logical arrangement of a memory device in accordance with one embodiment. In particular, the memory device 600 includes a memory array 605 comprising an array of memory cells arranged in a plurality of rows and columns. A plurality of word lines 607 (including the earlier-described write word lines and read word lines) are provided through the array in order to allow individual rows of memory cells to be addressed by the word line drivers 630 during write and read operations. In addition, a plurality of bit lines 609 (including the write bit line pairs, and the read bit lines referred to earlier) are provided in association with the columns of memory cells. Each column is coupled to the relevant write and read bit lines to enable data to be written into an activated memory cell of the column during a write operation, and for data to be read from an activated memory cell of the column during a read operation.

Precharge circuitry 615 is used to precharge the voltage level on the bit lines under the control of control circuitry 610. Following the precharge operation, a write operation or read operation can be performed. For a write operation, the control circuitry 610 will issue a control signal to the word line drivers 630 in order to cause a particular row of memory cells to be activated via the associated write word line, and the control circuitry 610 will further cause the write driver circuitry 625 to control the voltages on the relevant write bit line pairs, in order to cause the required data values to be written into the memory cells of the activated row. For a read operation, again the control circuitry 610 will issue a control signal to the word line drivers 630 in order to cause a particular row of memory cells to be activated via the appropriate read word line, and the sense amplifier circuitry 620 will then be used in order to evaluate the voltages on the relevant read bit lines, with the sensed read data then being returned to the control circuitry 610.

In addition, as described earlier, whenever particular memory cell groups are placed in the non-active mode of operation, the control circuitry 610 can set the clamp enable (CLAMP EN) signal to the relevant clamping circuits 650, to cause the associated read bit lines to be pulled to ground potential, thereby reducing leakage current.

Whilst FIG. 7 is intended to logically illustrate the arrangement of the memory device, it will be appreciated that it is not intended to provide an indication of the structural arrangement. For example, as will be apparent from the earlier discussion, the sense amplifier circuitry 620 is actually embedded within blocks forming the memory array, as is the precharge circuitry 615 and clamping circuitry 650.

Figure 8:
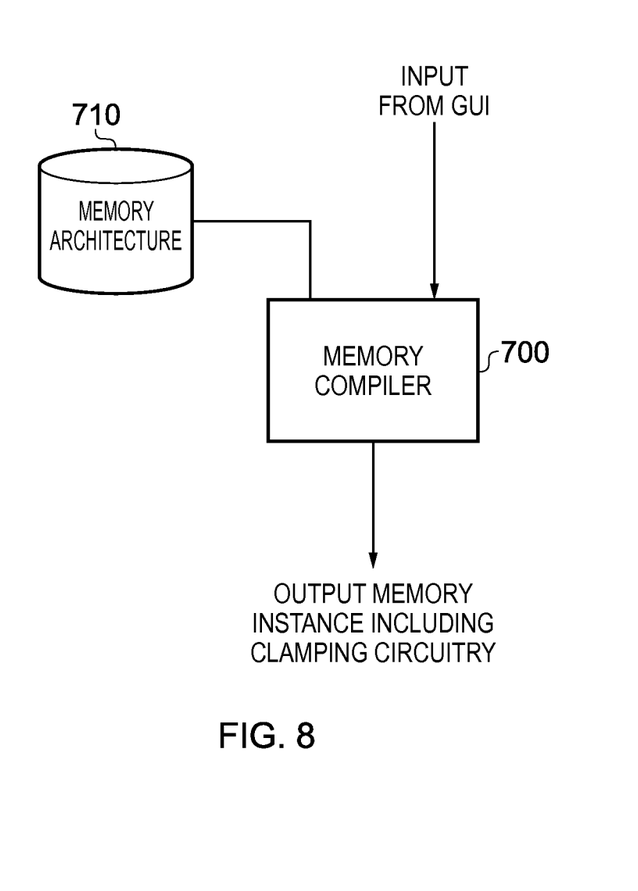
FIG. 8 is a diagram schematically illustrating the operation of a memory compiler to generate a memory instance including clamp circuitry of the described embodiments.

FIG. 8 schematically illustrates how a memory instance including clamping circuitry in accordance with the above described embodiments may be created from a memory compiler 700 with reference to a memory architecture 710. The memory architecture 710 specifies a definition of circuit elements and data defining rules for combining those circuit elements in order to create a memory instance. Particular requirements for the memory instance are entered into the memory compiler 700 as input parameters via a graphical user interface (GUI). As will be appreciated by those skilled in the art, such input parameters can specify various aspects of the desired memory instance, for example defining the size of the memory array, the multiplexing arrangements of the memory array, selection of various optional features such as power gating features, built-in-self-test (BIST) modes to be supported, etc.

The memory compiler 700 then generates the required memory instance based on the input parameters and the memory architecture 710. In accordance with one embodiment, the memory compiler includes, in association with the local read bit line of each column group, clamping circuitry to be activated by a clamp enable signal in the manner described with reference to the earlier figures.

Figure 9:
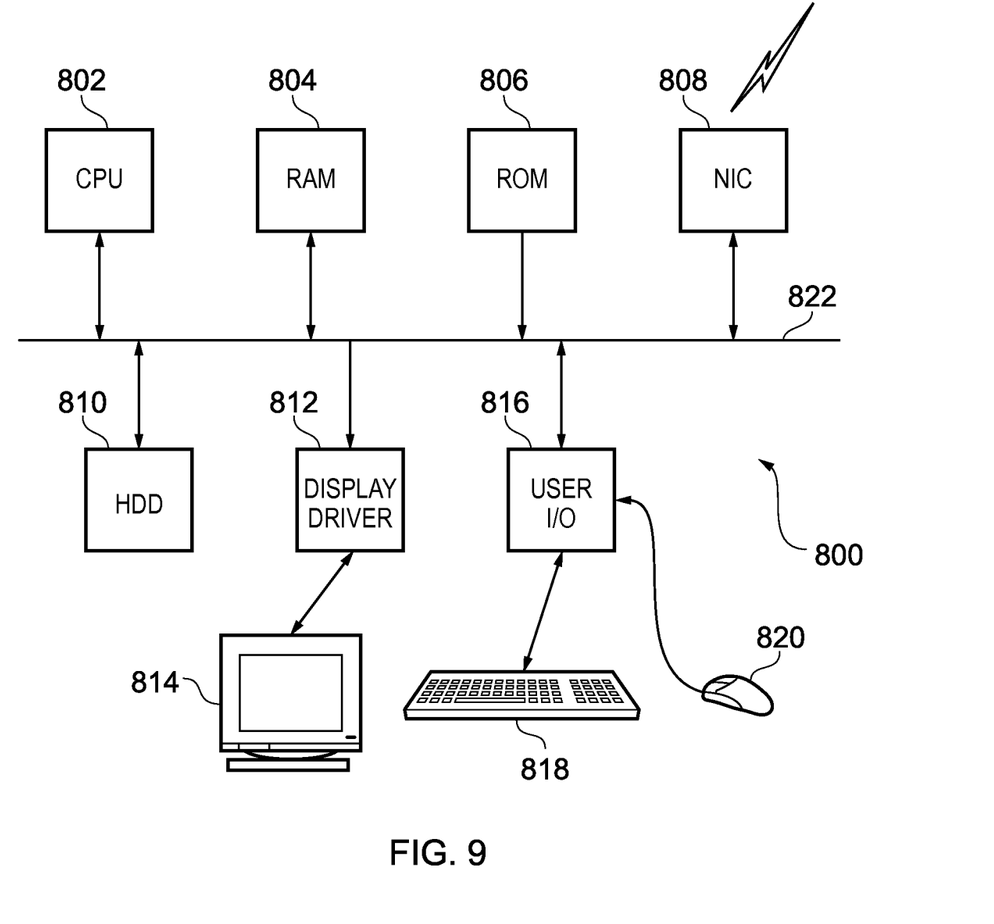
FIG. 9 is a diagram of a computer system on which a memory compiler operation may be performed to generate a memory instance conforming to the above described embodiments.

FIG. 9 schematically illustrates a general purpose computer 800 of the type that may be used to implement the above described memory compilation operation in order to generate a memory instance. The general purpose computer 800 includes a central processing unit 802, a random access memory 804, a read only memory 806, a network interface card 808, a hard disk drive 810, a display driver 812 and monitor 814 and a user input/output circuit 816 with a keyboard 818 and mouse 820 all connected via a common bus 822. In operation the central processing unit 802 will execute computer program instructions that may be stored in one or more of the random access memory 804, the read only memory 806 and the hard disk drive 810 or dynamically downloaded via the network interface card 808. The results of the processing performed may be displayed to a user via the display driver 812 and the monitor 814. User inputs for controlling the operation of the general purpose computer 800 may be received via the user input output circuit 816 from the keyboard 818 or the mouse 820 (and hence for example the input parameters used to determine certain properties of the required memory instance can be entered via this mechanism) It will be appreciated that the computer program could be written in a variety of different computer languages. The computer program may be stored and distributed on a recording medium or dynamically downloaded to the general purpose computer 800. When operating under control of an appropriate computer program, the general purpose computer 800 can perform the above described memory compiler operation and can be considered to form an apparatus for performing the above described memory compiler operation. The architecture of the general purpose computer 800 could vary considerably and FIG. 9 is only one example.

From the above described embodiments, it will be seen that a clamping mechanism is provided for reducing leakage current that might otherwise arise within memory cell groups placed in the non-active mode of operation. The circuitry required to implement this feature involves only a few gates, and therefore has a minimal impact on area of the memory device.

Although particular embodiments have been described herein, it will be appreciated that the invention is not limited thereto and that many modifications and additions thereto may be made within the scope of the invention. For example, various combinations of the features of the following dependent claims could be made with the features of the independent claims without departing from the scope of the present invention.

We claim:
1. A memory device comprising:
an array of memory cells arranged as a plurality of rows and columns, each row of memory cells being coupled to an associated read word line, each column of memory cells forming at least one column group, and the memory cells of each column group being coupled to an associated read bit line, each column group having an active mode of operation where a read operation may be performed on an activated memory cell within the at least one column group, and a non-active mode of operation where said read operation cannot be performed;
precharge circuitry configured, for each column group in said active mode of operation, to precharge the associated read bit line to a first voltage level prior to said read operation;
each memory cell comprising coupling circuitry connected between the associated read bit line and a second voltage level different to said first voltage level, during said read operation the coupling circuitry associated with the activated memory cell being configured to selectively discharge the associated read bit line towards the second voltage level dependent on a data value stored within the activated memory cell; and
clamping circuitry having one or more transistors configured, for each column group in said non-active mode of operation, to connect the associated read bit line to said second voltage level to reduce a leakage current through the coupling circuitry of each memory cell of the at least one column group.

2. A memory device as claimed in claim 1, wherein said precharge circuitry is disabled for each column group in said non-active mode of operation.

3. A memory device as claimed in claim 1, further comprising control circuitry configured to generate a clamp enable signal for each of the one or more transistors and to set the clamp enable signal for each of the one or more transistors associated with a column group in said non-active mode, each of the one or more transistors being responsive to the set clamp enable signal to connect the associated read bit line to said second voltage level.

4. A memory device as claimed in claim 1, wherein each of the one or more transistors comprises an NMOS transistor, and wherein the clamp enable signal is set to a logic one value.

5. A memory device as claimed in claim 1, further comprising:
sense amplifier circuitry connected to the associated read bit line of each column group and configured, during said read operation, to determine whether the voltage on the read bit line associated with any column group in said active mode of operation that includes said activated memory cell transitions towards the second voltage level, such a transition indicating that a data value stored in the activated memory cell has a first value.

6. A memory device as claimed in claim 5, wherein:
said sense amplifier circuitry comprises a plurality of sense amplifier units, each sense amplifier unit being connected to the associated read bit line of at least one column group; and
when each column group in said at least one column group associated with one of said sense amplifier units is in said non-active mode of operation, the action of the clamping circuitry to connect to said second voltage level each associated read bit line for said at least one column group causes an output signal of the one of said sense amplifier units to be set to a first predetermined state which reduces leakage current in the coupling circuitry used to couple the output signal of the one of said sense amplifier unit to a global bit line.

7. A memory device comprising:
an array of memory cells arranged as a plurality of rows and columns, each row of memory cells being coupled to an associated read word line, each column of memory cells forming at least one column group, and the memory cells of each column group being coupled to an associated read bit line, each column group having an active mode of operation where a read operation may be performed on an activated memory cell within the at least one column group, and a non-active mode of operation where said read operation cannot be performed;
precharge circuitry configured, for each column group in said active mode of operation, to precharge the associated read bit line to a first voltage level prior to said read operation;
each memory cell comprising coupling circuitry connected between the associated read bit line and a second voltage level different to said first voltage level, during said read operation the coupling circuitry associated with the activated memory cell being configured to selectively discharge the associated read bit line towards the second voltage level dependent on a data value stored within the activated memory cell; and
clamping circuitry configured, for each column group in said non-active mode of operation, to connect the associated read bit line to said second voltage level to reduce a leakage current through the coupling circuitry of each memory cell of the at least one column group; and
sense amplifier circuitry connected to the associated read bit line of each column group and configured, during said read operation, to determine whether the voltage on the read bit line associated with any column group in said active mode of operation that includes said activated memory cell transitions towards the second voltage level, such a transition indicating that a data value stored in the activated memory cell has a first value,
said sense amplifier circuitry comprising a plurality of sense amplifier units, each sense amplifier unit being connected to the associated read bit line of at least one column group,
wherein, when each column group in said at least one column group associated with one of said sense amplifier units is in said non-active mode of operation, the action of the clamping circuitry to connect to said second voltage level each associated read bit line for said at least one column group causes an output signal of the one of said sense amplifier units to be set to a first predetermined state which reduces leakage current in the coupling circuitry, which is used to couple the output signal of the one of said sense amplifier unit to a global bit line, and
wherein said global bit line is precharged to said first voltage level, and selectively discharged during said read operation to said second voltage level, and said first predetermined state causes the further coupling circuitry to connect the global bit line to said second voltage level.

8. A memory device as claimed in claim 7, wherein said further coupling circuitry comprises further NMOS transistor circuitry connected between said global bit line and said second voltage level, and said first predetermined state is a logic 1 value.

9. A memory device as claimed in claim 6, wherein:
each sense amplifier unit is associated with a pair of column groups, and comprises a NAND gate structure; and
both column groups in said pair are in the non-active mode of operation at the same time, and the action of the clamping circuitry to connect to said second voltage level the associated read bit line for both column groups in said pair reduces leakage current within said NAND gate structure during said non-active mode of operation.

10. A memory device as claimed in claim 1, further comprising:
word line driver circuitry configured, during a read operation, to issue an asserted read word line pulse signal on the read word line coupled to an addressed row of the array so as to activate the memory cells within the addressed row whilst the read word line pulse signal is asserted; and
sense amplifier circuitry connected to the associated read bit line of each column group, and configured for the activated memory cell to determine the activated memory cell stores a first value if the voltage on the associated read bit line transitions to a trip voltage level between said first and said second voltage levels whilst the read word line pulse signal is asserted, and to determine the activated memory cell stores a second value if the voltage on the associated read bit line does not transition to said trip voltage level whilst the read word line pulse signal is asserted.

11. A memory device comprising:
an array of memory cells arranged as a plurality of rows and columns, each row of memory cells being coupled to an associated read word line, each column of memory cells forming at least one column group, and the memory cells of each column group being coupled to an associated read bit line, each column group having an active mode of operation where a read operation may be performed on an activated memory cell within the at least one column group, and a non-active mode of operation where said read operation cannot be performed;
precharge circuitry configured, for each column group in said active mode of operation, to precharge the associated read bit line to a first voltage level prior to said read operation;
each memory cell comprising coupling circuitry connected between the associated read bit line and a second voltage level different to said first voltage level, during said read operation the coupling circuitry associated with the activated memory cell being configured to selectively discharge the associated read bit line towards the second voltage level dependent on a data value stored within the activated memory cell;
clamping circuitry configured, for each column group in said non-active mode of operation, to connect the associated read bit line to said second voltage level to reduce a leakage current through the coupling circuitry of each memory cell of the at least one column group;
word line driver circuitry configured, during a read operation, to issue an asserted read word line pulse signal on the read word line coupled to an addressed row of the array so as to activate the memory cells within the addressed row whilst the read word line pulse signal is asserted;
sense amplifier circuitry connected to the associated read bit line of each column group, and configured for the activated memory cell to determine that the activated memory cell stores a first value if the voltage on the associated read bit line transitions to a trip voltage level between said first and said second voltage levels whilst the read word line pulse signal is asserted, and to determine that the activated memory cell stores a second value if the voltage on the associated read bit line does not transition to said trip voltage level whilst the read word line pulse signal is asserted; and bit line keeper circuitry coupled to each read bit line and configured during a read operation to weakly pull the voltage on each read bit line towards the first voltage level so as to avoid leakage current within the coupling circuitry of the memory cells of the associated memory cell group from causing the voltage on the associated read bit line to transition to said trip voltage level between said first and said second voltage levels whilst the read word line pulse signal is asserted.

12. A memory device as claimed in claim 1, wherein the coupling circuitry of each memory cell comprises a plurality of coupling transistors arranged in series between the associated read bit line and a terminal at said second voltage level, a gate terminal of at least one of the coupling transistors being connected to the associated read word line and a gate terminal of at least one other of the coupling transistors being connected to an internal storage node of the memory cell.

13. A memory device as claimed in claim 1, wherein the first voltage level is a supply voltage level and the second voltage level is a ground voltage level.

14. A memory device as claimed in claim 1, wherein each column of memory cells forms a plurality of column groups.

15. A method comprising:

controlling leakage current within a memory device having an array of memory cells arranged as a plurality of rows and columns, each row of memory cells being coupled to an associated read word line, each column of memory cells forming at least one column group, and the memory cells of each column group being coupled to an associated read bit line, each column group having an active mode of operation where a read operation may be performed on an activated memory cell within the at least one column group, and a non-active mode of operation where said read operation cannot be performed, wherein controlling the leakage current comprises:

for each column group in said active mode of operation, precharging the associated read bit line to a first voltage level prior to said read operation;

for each memory cell, providing coupling circuitry connected between the associated read bit line and a second voltage level different to said first voltage level;

during said read operation, employing the coupling circuitry associated with the activated memory cell to selectively discharge the associated read bit line towards the second voltage level dependent on a data value stored within the activated memory cell; and for each column group in said non-active mode of operation, connecting the associated read bit line to said second voltage level via one or more transistors to reduce a leakage current through the coupling circuitry of each memory cell of the at least one column group.

16. A memory device comprising:

an array of memory cell means arranged as a plurality of rows and columns, each row of memory cell means for coupling to an associated read word line, each column of memory cell means for forming at least one column group, and the memory cell means of each column group for coupling to an associated read bit line, each column group having an active mode of operation where a read operation may be performed on an activated memory cell means within the at least one column group, and a non-active mode of operation where said read operation cannot be performed;

precharge means, for each column group in said active mode of operation, for precharging the associated read bit line to a first voltage level prior to said read operation;

each memory cell means comprising coupling means for connecting between the associated read bit line and a second voltage level different to said first voltage level, during said read operation the coupling means associated with the activated memory cell means for selectively discharging the associated read bit line towards the second voltage level dependent on a data value stored within the activated memory cell means; and clamping means, for each column group in said non-active mode of operation, for connecting the associated read bit line to said second voltage level via one or more transistors to reduce a leakage current through the coupling means of each memory cell means of the at least one column group.

17. A computer program storage medium storing a memory compiler computer program for controlling a computer to generate an instance of a memory device from a memory architecture associated with the memory compiler computer program, the memory architecture specifying a definition of circuit elements and data defining rules for combining those circuit elements, such that said instance generated specifies a memory device as claimed in claim 1.

18. A memory device as claimed in claim 1, wherein the clamping circuitry is configured to selectively discharge the associated read bit line towards the second voltage level to reduce the leakage current through the coupling circuitry of each memory cell of the at least one column group.

19. A memory device as claimed in claim 16, wherein the clamping means is configured to selectively discharge the associated read bit line towards the second voltage level to reduce the leakage current through the coupling circuitry of each memory cell of the at least one column group.

* * * * *